(12) United States Patent
Hurley et al.

(10) Patent No.: US 7,247,683 B2
(45) Date of Patent: Jul. 24, 2007

(54) LOW VOIDING NO FLOW FLUXING UNDERFILL FOR ELECTRONIC DEVICES

(75) Inventors: James M. Hurley, Atlanta, GA (US); Mark Wilson, Cumming, GA (US); Xiaoyun Ye, Alpharetta, GA (US)

(73) Assignee: Fry's Metals, Inc., Alpharetta, GA (US)

( * ) Notice: Subject to any disclaimer, the term of this patent is extended or adjusted under 35 U.S.C. 154(b) by 428 days.

(21) Appl. No.: 10/911,908

(22) Filed: Aug. 5, 2004

(65) Prior Publication Data

US 2006/0030682 A1    Feb. 9, 2006

(51) Int. Cl.
*C08L 61/06* (2006.01)
*C08L 63/00* (2006.01)
*C08L 63/02* (2006.01)

(52) U.S. Cl. .................. 525/481; 523/201; 523/205; 523/466; 523/467; 525/65; 525/114; 525/487

(58) Field of Classification Search .................. None
See application file for complete search history.

(56) References Cited

U.S. PATENT DOCUMENTS

| | | | |
|---|---|---|---|
| 3,356,645 A | 12/1967 | Warren | |
| 3,418,333 A | 12/1968 | Warren | |
| 3,813,379 A | * 5/1974 | Brouwers et al. | 523/427 |
| 5,128,746 A | 7/1992 | Pennisi et al. | |
| 5,376,403 A | 12/1994 | Capote et al. | |
| 5,473,091 A | * 12/1995 | Ichiroku et al. | 558/72 |
| 5,543,585 A | 8/1996 | Booth et al. | |
| 5,601,675 A | 2/1997 | Hoffmeyer et al. | |
| 5,703,406 A | 12/1997 | Kang | |
| 5,783,867 A | 7/1998 | Belke, Jr. et al. | |
| 5,985,043 A | 11/1999 | Zhou et al. | |
| 5,985,456 A | 11/1999 | Zhou et al. | |
| 6,063,828 A | 5/2000 | Ma et al. | |
| 6,100,114 A | 8/2000 | Milkovich et al. | |
| 6,121,689 A | 9/2000 | Capote et al. | |
| 6,168,972 B1 | 1/2001 | Wang et al. | |
| 6,180,696 B1 * | 1/2001 | Wong et al. | 523/457 |
| 6,194,788 B1 | 2/2001 | Gilleo et al. | |
| 6,228,678 B1 | 5/2001 | Gilleo et al. | |
| 6,228,681 B1 | 5/2001 | Gilleo et al. | |
| 6,238,223 B1 | 5/2001 | Cobbley et al. | |
| 6,274,650 B1 | 8/2001 | Cui | |
| 6,297,560 B1 | 10/2001 | Capote et al. | |
| 6,323,062 B1 | 11/2001 | Gilleo et al. | |
| 6,350,841 B1 | 2/2002 | Schultz et al. | |
| 6,358,354 B1 | 3/2002 | Patil | |
| 6,380,322 B1 | 4/2002 | Wong et al. | |
| 6,395,124 B1 | 5/2002 | Oxman et al. | |
| 6,399,178 B1 | 6/2002 | Chung | |
| 6,399,426 B1 | 6/2002 | Capote et al. | |
| 6,458,472 B1 | 10/2002 | Konarski et al. | |
| 6,467,676 B1 | 10/2002 | Wang | |
| 6,632,893 B2 | 10/2003 | Konarski et al. | |
| 6,706,417 B2 | 3/2004 | Konarski et al. | |
| 7,166,491 B2 | 1/2007 | Wilson et al. | |
| 7,213,739 B2 | 5/2007 | Wilson et al. | |
| 2001/0000929 A1 | 5/2001 | Gilleo | |
| 2001/0003058 A1 | 6/2001 | Gilleo et al. | |
| 2001/0017414 A1 | 8/2001 | Gilleo | |
| 2002/0014703 A1 | 2/2002 | Capote et al. | |
| 2002/0019075 A1 | 2/2002 | Brand | |
| 2002/0020491 A1 | 2/2002 | Price et al. | |
| 2002/0025602 A1 | 2/2002 | Jiang et al. | |
| 2002/0031868 A1 | 3/2002 | Capote et al. | |
| 2002/0089067 A1 | 7/2002 | Crane et al. | |
| 2003/0111519 A1 | 6/2003 | Kinney et al. | |

FOREIGN PATENT DOCUMENTS

| | | | |
|---|---|---|---|
| JP | 55-98848 A | | 7/1980 |
| JP | 57-40963 A | * | 3/1982 |
| JP | 60-11525 A | | 1/1985 |
| JP | 60-190418 A | * | 9/1985 |
| JP | 60-190418 A2 | | 9/1985 |
| JP | 60-219756 A | * | 11/1985 |
| JP | 4-68019 A | * | 3/1992 |
| JP | 4-249525 A | * | 9/1992 |
| JP | 5-214074 A | * | 8/1993 |
| JP | 6-49329 A | * | 2/1994 |
| JP | 6-228279 A | * | 8/1994 |
| JP | 10-135255 A | * | 5/1998 |

(Continued)

OTHER PUBLICATIONS

Chemical abstracts registry No. 115-27-5 for chlorendic anhydrdide, 1974.*

(Continued)

*Primary Examiner*—Robert Sellers
(74) *Attorney, Agent, or Firm*—Senniger Powers

(57) ABSTRACT

A no flow fluxing underfill having a hardener component comprising a phenolic component and an anhydride component in a molar ratio of phenolic component to anhydride component of between about 0.1:1 and about 2:1; or between about 0.8:1 and about 1.2:1. An underfill preparation method involving blending an epoxy component and a phenolic component, heating the blend, and cooling the blend, prior to incorporation of an anhydride component.

48 Claims, No Drawings

FOREIGN PATENT DOCUMENTS

WO     WO 99/04430     1/1999

OTHER PUBLICATIONS

Chemical abstracts registry No. 2386-87-0 for 3,4-epoxycyclohexylmethyl-3,4-epoxycyclohexanecarboxylate, 1974.*

Lee, H. and Neville, K., Handbook of Epoxy Resins 1982 Reissue, 1982, pp. 5-18, McGraw-Hill, NY.

Blank, Z He and Picci, M., "Catalysis of the Epoxy-Carboxyl Reaction" Proceeding, Int. Waterborne, High-Solids and Powder Coatings Symposium, Feb. 21-23, 2001, New Orleans, LA.

* cited by examiner

LOW VOIDING NO FLOW FLUXING UNDERFILL FOR ELECTRONIC DEVICES

FIELD OF THE INVENTION

The present invention relates to underfill compositions and methods for device attachment in electronic devices having solder interconnects.

BACKGROUND OF THE INVENTION

Electrical components such as resisters, capacitors, inductors, transistors, integrated circuits, and chip carriers are typically mounted on circuit boards according to one of two configurations. In the first configuration, the components are mounted on one side of the board and leads from the components extend through holes in the board and are soldered on the opposite side of the board. In the second configuration, the components are soldered to the same side of the board upon which they are mounted. These latter devices are said to be "surface-mounted."

Surface mounting of electronic components is used to fabricate small circuit structures and lends itself well to process automation. A type of surface-mounted device referred to as an area array package comprises an electronic component such as an integrated circuit having numerous connecting leads attached to pads mounted on the underside of the device.

Examples of area array packages include a flip chip, a chip scale package (CSP), and a ball grid array (BGA). In connection with the use of an area array package, either the circuit board or the device is provided with small bumps or balls of solder (hereinafter "bumps" or "solder bumps") positioned in locations which correspond to the pads on the underside of each device and on the surface of the circuit board. The device is mounted by (a) placing it in contact with the board such that the solder bumps become sandwiched between the pads on the board and the corresponding pads on the device; (b) heating the assembly to a point at which the solder is caused to reflow (i.e., melt); and (c) cooling the assembly. Upon cooling, the solder hardens, thereby mounting the device to the board. Tolerances in area array technology are critical, as the spacing between individual devices as well as the spacing between the devices and the board is typically small. For example, spacing of a flip chip from the surface of a board to the bottom of a die is typically between about 15 and about 75 microns and is expected to approach about 10 microns in the near future.

One problem associated with area array technology is that the chips, the solder, and the material forming the circuit board often have significantly different coefficients of thermal expansion. As a result of the differing expansions, the heating of the assembly during manufacture and use can cause severe stresses. Further, substantial stresses occur when devices are dropped (e.g., wireless telephones and portable computers). The stresses imposed on the solder interconnects can lead to failures that degrade device performance or incapacitate the device entirely.

In order to minimize thermomechanical fatigue resulting from different thermal expansions, thermoset epoxies have been used as an underfill material which surrounds the periphery of the area array device and occupies the space beneath the chip between the underside of the chip and the board which is not occupied by solder. Such epoxy systems provide a level of protection by forming a physical barrier which resists or reduces the stress on solder interconnects due to different expansions among the components of the device and/or to drop shocks.

Several trends have become increasingly important in the technology of area-array surface mounted devices. These include 1) increasing flip-chip and BGA die sizes, 2) increasing number of electrical interconnects, 3) decreasing gap-heights between the die and substrate, 4) a drive for increased through-put, and 5) incorporation of fragile low-K dielectric layers in the silicon die. To address these issues, there has been intense interest in the use of so-called "no-flow underfills" (NUF). These are typically thermosetting, epoxy-based materials which contain fluxing agents.

No-flow underfill is applied directly to a board before device placement. When heat is applied as in, for example, a reflow oven, the fluxing agents begin removing metal oxides on the solder balls and on the pads, which enables solder wetting and solder joint formation above the liquidus temperature of the solder. Simultaneously, the underfill begins to polymerize (cure), forming a strong adhesive layer between the die (or BGA/CSP) and the boards. This adhesive layer acts to distribute thermal stresses between the components, and thus increases the device reliability.

Existing NUF materials often exhibit undesirable properties, such as lack of sufficient fluxing ability (resulting in poor electrical yield), excessive volatility, out-gassing, or formation of bubbles or voids in the underfill layer, which can adversely affect the reliability of the device. These deficiencies are closely related to the chemistries used in NUF. For example, a typical commercial NUF is composed of a liquid epoxy resin, a anhydride curing agent (which is volatile at elevated reflow temperatures), as well as lesser amounts of a cure accelerator and additives which are either acidic (e.g. carboxylic acids), or additives which react with the anhydride to form acidic species in-situ during cure (e.g., active hydrogen compounds such as alcohols). Because of their comparatively high volatility, anhydride compounds, in particular, included in NUF materials contribute to void formation. Voids degrade the reliability of the underfill by allowing solder "bridging" to occur, especially at the high reflow temperatures needed for lead free solder applications, or by acting as stress-concentrators which lead to underfill crack growth during thermal cycling.

No-flow underfills have been prepared by mixing the epoxy resin and curing agents together until the mixture is uniform, and then any remaining constituents such as wetting agents, defoaming agents, and CTE modifiers have been dissolved or mixed into the solution.

The possibilities for designing an improved NUF having reduced voiding potential and increased fluxing activity been limited by a variety of performance requirements, such as a) good pot life and shelf life, b) acceptable viscosity to render the material dispensable, c) high $T_g$, d) strong adhesion to die passivation and solder mask, e) high fracture toughness $K_{1c}$, f) moisture resistance, and others.

SUMMARY OF THE INVENTION

Among the objects of the invention, therefore, are to provide underfill compositions having reduced volatility and voiding potential; to provide underfill compositions having increased fluxing activity; to provide underfill compositions having good pot life and shelf life; to provide underfill compositions having low viscosity to render the material dispensable; to provide underfill compositions having high $T_g$; to provide underfill compositions having strong adhesion to die passivation and solder mask; to provide underfill compositions having high fracture toughness $K_{1c}$; to provide underfill compositions having moisture resistance.

Briefly, therefore, the invention is directed to an underfill composition for use in electronics manufacture, the composition comprising an epoxy component, and a hardener component comprising a phenolic component and an anhydride component in a molar ratio of phenolic component to anhydride component of between about 0.1:1 and about 2:1.

The invention is also directed to a method of preparing an underfill composition of the type comprising an epoxy component, an anhydride component, and a phenolic component for use in electronics manufacture. The method involves blending the epoxy component and at least about 80 wt % of the phenolic component to yield an epoxy/phenolic blend; and blending the anhydride component into the epoxy/phenolic blend in an amount to yield an underfill composition, such that the underfill composition has a molar ratio of phenolic component to anhydride component of between about 0.1:1 and about 2:1.

In another aspect the invention is directed to a method of preparing an underfill composition of the type comprising an epoxy component, an anhydride component, and a phenolic component for use in electronics manufacture. This method involves blending the epoxy component and at least about 80 wt % of the phenolic component to yield an epoxy/phenolic blend; heating the epoxy/phenolic blend to a temperature greater than a softening temperature of the phenolic component; cooling the epoxy/phenolic blend; and blending the anhydride component into the epoxy/phenolic blend to yield the underfill composition.

Other objects and features of the invention will be in part apparent and in part pointed out hereinafter.

DETAILED DESCRIPTION OF PREFERRED EMBODIMENTS

The underfill composition of the invention includes an epoxy component, an anhydride component, a phenolic component, a latent catalyst, and other additives as described hereinbelow.

Epoxy

The major epoxy component is selected from among epoxy resins that are considered to be thermoset, rather than thermoplastic. In general, thermoplastic materials are minimally crosslinked and become soft and deformable upon being heated. In contrast, thermoset materials are highly crosslinked and become hard and rigid upon being heated. Because of this and other differences, thermoset materials typically tend to provide more strength to the package (e.g., greater mechanical shock resistance and thermal cycling resistance) than thermoplastic materials. Despite not providing as much strength to an underfill, thermoplastic materials may be selected for inclusion in an underfill to provide a degree of reworkability.

The difference in the structure of thermoset and thermoplastic materials (i.e., the degree of crosslinking) is also reflected in the temperature-related properties of the epoxy component. Of particular interest is the glass transition temperature ($T_g$) of the cured epoxy component. The glass transition temperature is the temperature at which the polymer transforms from being solid-like and exhibiting an elastic deformation profile to being rubber-like and exhibiting a viscous deformation profile. Additionally, the transformation at $T_g$ is typically associated with a substantial increase in the coefficient of thermal expansion (CTE) and a significant decrease in the storage or bulk modulus.

Typically, the $T_g$ of a thermoset material is greater than that of a thermoplastic material. For example, a cured thermoset material such as diglycidyl ether of bisphenol A (also referred to herein as a "bis-A epoxy resin") has a $T_g$ of about 70 to about 220° C., depending on the curing agent and/or hardeners, etc., whereas a thermoplastic material such as INCHEMREZ PHENOXY PKHJ has a $T_g$ of about 95° C. In general, the epoxy component has a $T_g$ of at least about 70° C. when cured. In one embodiment the epoxy component is selected to have a $T_g$ of between about 60 and about 90° C. when cured. In another embodiment the epoxy is selected to have a $T_g$ of between about 90 and about 150° C. when cured.

The melt temperature ($T_m$) or softening point (for a substance which does not have a definite melting point, the temperature at which viscous flow changes to plastic flow) for the epoxy component is between about −50 and about 0° C. Softening point can be determined by JIS K 7234.1986 or ASTM D 6493-99. The melting temperature can be determined by differential scanning calorimetry (DSC) according to standard ISO 11357-5 or ASTM E 794-01. The epoxy component is also typically considered to be relatively pure. For example, the epoxy component preferably contains less than about 500 ppm of hydrolysable chloride (ASTM D1726).

The epoxy resin component may comprise any appropriate type of molecule that comprises at least one epoxide group (i.e., it is at least monofunctional). Difunctional and/or multifunctional resins may be selected, alone or in combination with monofunctional resins, to increase to crosslink density, which increases the glass transition temperature of the underfill solution. An appropriate epoxy resin component typically comprises an epoxy resin(s) that has a number of repeat units (i.e., degree of polymerization) that is between about 1 and about 7. Preferably, the number of repeat units is between about 1 and about 3.

The epoxy resin component typically comprises between about 25 and about 75 weight percent of the underfill solution. Although atypical, the concentration of the epoxy resin component may be varied to a concentration outside the foregoing range without departing from the scope of the present invention. Depending on the particular application, the concentration of the epoxy resin component may, for example, be as little as about 15 weight percent of the underfill solution or lower; or as great as 80 weight percent or more. Preferably, the epoxy resin component comprises between about 50 and about 70 weight percent of the underfill solution.

Depending on the desired characteristics of the underfill solution and/or the cured underfill, the epoxy resin component may comprise a single epoxy resin or a combination of epoxy resins. In one embodiment the epoxy resin component, or components where a blend is used, is selected from among glycidylethers of bisphenol A, glycidylethers of bisphenol F, naphthalenic epoxy, cycloaliphatic epoxy, epoxy-functional reactive diluents, and others. For example, it is selected from the group consisting of a diglycidyl ether of bisphenol A, a diglycidyl ether of bisphenol F, a triglycidyl ether of triphenomethane, a polyglycidyl ether of novolac, a polyglycidyl ether cresol novolac, a polyglycidyl ether of napthalenic phenol, and methyl, ethyl, propyl, and butyl substituted versions thereof. For example, it may be desirable to include a trifunctional epoxy resin to increase the amount of crosslinking in the cured underfill, which increases the $T_g$ of the underfill. A polyglycidyl ether of cresol novolac may be included as part of the epoxy resin component in order to improve high temperature performance. A bis-A epoxy resin is typically included to increase the glass transition temperature and/or raise the viscosity of the underfill solution. Whereas a diglycidyl ether of bisphenol F (may herein be referred to as a "bis-F epoxy resin") is usually included to decrease the viscosity.

Specific examples of suitable epoxy resins for inclusion in the NUF compositions of the invention include the following:

Specific examples of suitable epoxy resins for inclusion in the NUF compositions of the invention include the following: Bis-F epoxy resins: Epalloy 8229, 8230, 8230E, 8240 and 8240E (CVC Specialty Chemicals Inc. Moorestown, N.J.), Epiclon® 830, 830-S, 830-LVP, 835 and 835-LV (Dainipppon Ink & Chemicals, Inc. Tokyo, Japan), Epon Resin 862 (Resolution Performance Products, Houston, Tex. USA), RE-304S (Nippon Kayaku Co. Ltd., Tokyo Japan); Bis-A epoxy resins: Epalloy 7190 (CVC Specialty Chemicals Inc. Moorestown, N.J.), Epon 824, 826, and 828 (Resolution Performance Products, Houston, Tex. USA), Epiclon 840, 840-S, 850, 850-S 850-CRP and 850-LC (Dainipppon Ink & Chemicals, Inc. Tokyo, Japan), DER 330 and 331 (Dow Chemical, Midland, Mich. USA), RE-310S (Nippon Kayaku Co. Ltd., Tokyo Japan); Naphthalene epoxy resins: HP-4032 and HP-4032D (Dainipppon Ink & Chemicals, Inc. Tokyo, Japan); Cycloaliphatic Epoxy: ERL-4221 (Union Carbide Corp., Danbury, Conn.), Arladite CY 179 (Huntsman Advanced Materials, Salt Lake City, Utah); Tri-functional epoxy resin: Epikote 1032 (Japan Epoxy Resins Co. Ltd., Tokyo, Japan), Tactix 742 (Huntsman Advanced Materials, Salt Lake City, Utah).

In view of the foregoing, sample combinations of epoxy include the following:
  a) 90% of bisphenol F epoxy and 10% of naphthalene epoxy
  b) 50% of bisphenol F epoxy and 50% bisphenol A epoxy
  c) 80% of bisphenol F epoxy and 20% cycloaliphatic epoxy
  d) 80% of bisphenol F epoxy, 10% tri-functional epoxy, 10% cycloaliphatic epoxy.

The glass transition temperature and other properties such as the modulus of a cured epoxy resin component are largely dependent upon the "equivalent weight" of the epoxy resin component, which is based on the equivalent weights of the various epoxy resins that make up the epoxy resin component. The equivalent weight of an epoxy resin is equal to the molecular weight of the epoxy resin molecule divided by the number of epoxide groups the molecule contains. For example, a bis-A epoxy resin available from Resolution under the tradename EPON 828 has a molecular weight of about 380 g/mole and comprises two epoxide groups per molecule, which corresponds to an equivalent weight of about 190. A conventional bis-F epoxy resin available from Resolution under the tradename EPON 862 is bifunctional and has an equivalent weight of about 170. In general, the greater the equivalent weight, the more flexible the cured epoxy will be because there is a greater distance between crosslink sites. Thus, to increase the stiffness and glass transition temperature, which is typically desirable in an underfill, epoxy resins with smaller equivalent weights or higher functionalities may be included as part of the epoxy resin component. In addition to affecting the physical properties of the epoxy resin, the equivalent weight also plays a role in determining the amount of fluxing curative that is included in the underfill solution. For example, the smaller the overall equivalent weight of the epoxy resin component (i.e., the equivalent weight of the epoxy resin component as a whole based on the relative amounts of the different epoxy resins that make up the epoxy resin component), the greater the number of epoxide crosslink sites for a given amount of epoxy resin component, and therefore, the greater the amount of fluxing curative that is needed to cure the epoxy resin component during solder reflow.

Anhydride

A first component of the curing agent used in the NUF compositions of the invention is an anhydride compound. Examples of suitable anhydride compounds include methylhexhydrophthalic anhydride, hexahydrophthalic anhydride, tetrahydrophthalic anhydride, dodecenyl succinic anhydride, methyl-5-norbornene-2,3-dicarboxylic anhydride. One function of the anhydride component is to react with the epoxy resin to create a highly crosslinked thermosetting polymer. Another function is to react with the phenolic component to form a mono-esterified carboxylic acid, which in turn functions as an active fluxing agent to remove metallic oxides, and facilitate solder interconnect formation.

The anhydride component constitutes between about 15 and about 90% of the overall hardener component, which comprises the anhydride and phenolic components. The anhydride component constitutes between about 30 and about 60% of the overall underfill composition.

Phenol

A second component of the curing agent used in the NUF compositions of the invention is a phenolic compound. Examples of suitable phenolic compounds include solid phenolic novolac compounds such as H-1, H-2, H-3, H-4, H-5, MEH-7500, -7800, -7851 (Meiwa Plastic Industries, Ltd. Tokyo, Japan), Rezicure 3000, 3010, 3020 and 3030 (Schenectady International Inc., Schenectady, N.Y. USA), GP 2074 and GP 5833 (Georgia-Pacific Resins Inc., Atlanta, Ga. USA) Durite SD-1731(Borden Chemical Inc., Louisville, Ky. USA), Tamanol Pa. and 758 (Arakawa Chemical Industries, Ltd. Osaka, Japan). Other examples include semi-solid or liquid phenolic resins, in particular, semi-solid or liquid allyl-substituted phenolic resins such as MEH 8000H, -8005, -8010 (Meiwa Plastic Industries, Ltd. Tokyo, Japan), and YLH903 (Japan Epoxy Resins Co. Ltd., Tokyo, Japan). The phenolic component acts as a hardener for the epoxy resin and also reacts with the anhydride component to form a mono-esterified carboxylic acid generally according to the following reaction:

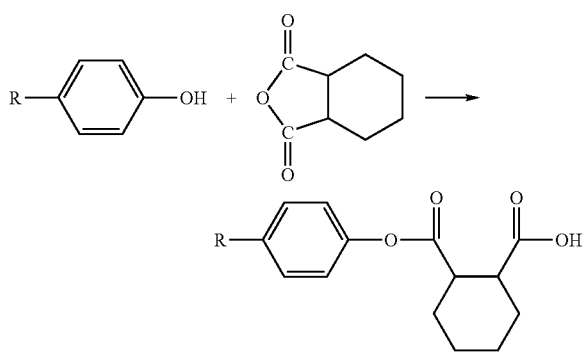

This carboxylic acid acts as the active fluxing agent and also reacts with some of the epoxy to yield a product such as the following:

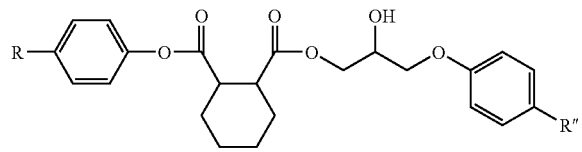

The phenolic component constitutes between about 10% and about 85% of the overall hardener component. The phenolic component constitutes between about 5% and about 60% of the overall underfill composition.

Latent Catalyst

To supplement the curing action of the anhydride/phenolic compounds, the NUF compositions of the invention employ a latent catalyst. The preferred catalyst is "latent" in that at low temperatures (approximately 40 deg ° C. and below), the rate of reaction and/or polymer cure is very slow, such that there is only a slow increase in the viscosity of the underfill. Among latent catalysts, those preferred are polymer bound catalysts and phosphonium salt-based catalysts, in particular, tetraaryl phosphonium salts, tetraalkyl phosphonium salts, mixed tetra(aryl/alkyl) phosphonium salts. At high temperatures (above 150 deg ° C.), the rate of reaction and polymerization becomes fast, allowing the underfill to achieve a state of complete cure in a short time-frame, typically less than 1-2 hours. Examples of suitable latent catalysts include catalysts from the group of solid quaternary phosphonium salts such as tetraphenylphosphonium-tetraphenylborate, tetrabutyphosphonium-tetraphenylborate, tetraphenylphosphonium tetra-p-tolyborate, etc., as are available from Hokko Chemical Industries (Tokyo, Japan). Additional examples of suitable latent catalysts include polymer-bound imidazoles such as Intelimer® 7002, 7004 or 7024 (Lubrizol Dock Resins, Linden, N.J.). This class of latent catalysts consists essentially of a imidazole catalyst which is "locked" or sequestered within a crystalline polymer matrix. When the polymer matrix is heated above its melting point (typically between 60-80 deg ° C.), the active catalyst is released, allowing for rapid curing of the epoxy resin. The amount of the latent catalyst is such that the peak cure temperature in a ramped DSC (10 C/min) according to ISO 11357-5 will have a value of between 150 and 220° C. The latent catalyst is incorporated in a proportion of between about 0.2 and about 2% by weight of the overall underfill composition.

Toughening Agent

A toughening agent is optionally included in the underfill composition to improve the fracture toughness and act as a stress reducing agent. The toughening agent is, for example, maleic-anhydride functionalized polybutadiene, dispersed submicron particles of acrylic or polysiloxane core-shell polymer, or a CTBN (carboxyl terminated butadiene-nitrile resin). If present, the concentration of the toughening agent is up to about 20 wt % of the underfill composition.

Proportions

The phenolic hardener and anhydride components are employed in a molar ratio of phenolic compound/anhydride compound between about 0.1:1 and about 2:1. Too high of a phenolic proportion renders the product too viscous. Too high of an anhydride proportion renders the product too volatile and subject to void formation. In one preferred embodiment, they are employed in a near stoichiometric mixture. That is, the molar ratio of these two components is between about 0.8:1 and about 1.2:1. In one preferred embodiment this molar ratio is between about 0.9:1 and about 1.1:1. Within this embodiment is a mixture in which the molar ratio is about 1:1. This ratio has been found to provide a good balance which avoids premature hardening while still forming enough carboxylic acid reaction product for perform a fluxing function in the underfill product.

The epoxy resin and the hardener components are incorporated in amounts such that the molar ratio of the epoxy resin to the total hardener is between about 0.6:1 and about 1.4:1. The total hardener is the cumulative phenol and anhydride. In one preferred embodiment, they are employed in a near stoichiometric mixture. That is, the molar ratio of the epoxy resin to the hardener component is between about 0.8:1 and about 1.2:1. In one preferred embodiment this molar ratio is between about 0.9:1 and about 1.1:1. Within this embodiment is a mixture in which this molar ratio is about 1:1.

Miscellaneous Additives

Although not required, other additives, such as wetting agents, defoaming agents, flow-enhancers, dispersing aids, flame retardants, coupling agents, stress reducing agents, and fillers may also be included in the underfill. A wetting agent is typically added to improve the film forming properties of the underfill and/or to enhance the bonding of the underfill to the surfaces of the integrated circuit device and printed circuit board by decreasing the surface tension of the underfill. Appropriate wetting agents include the following classes of materials: modified silicone resins, fluorocarbons, and acrylic resins. The most commonly used type of wetting agent in underfills are silanes. One such commercially available silane-type wetting agent is available from Byk Chemie of Wesel, Germany under the trade name BYK 306. If present, the concentration of a wetting agent in the underfill solution is typically kept near the minimum concentration at which effective wetting is accomplished because high concentrations can actually decrease adhesion. In general, the concentration of wetting agent is between about 0.005 and about 2.0 weight percent of the underfill solution. Preferably, the concentration of the wetting agent is between about 0.1 and about 0.5 weight percent of the underfill solution. It is to be noted that the BYK 306 wetting agent only contains 12 percent by weight wetting agent with the remainder being solvent. Thus, adding about 0.5 weight percent of BYK 306 to the underfill solution corresponds to adding about 0.06 weight percent wetting agent and about 0.44 weight percent of a solvent.

Defoaming agents, if present, are typically added prior to, or during, the mixing of the epoxy resin component, the fluxing curative, and the solvent to assist in the degassing of the underfill solution. Stated another way, a defoaming agent tends to minimize the formation of pockets of entrapped air in the underfill solution. Such pockets of entrapped air tend to result in the formation of voids in the cured underfill that typically degrade the adhesion and the thermal stress compensation effect of the underfill. Appropriate defoaming agents include the classes of materials of polyether modified siloxanes and methylalkyl siloxanes. The most commonly used defoaming agents comprise modified polysiloxanes. Specific examples of such defoaming agents include BYK 525, BYK 530, and BYK 535 available from Byk Chemie of Wesel, Germany. Another type of defoaming agent that comprises a modified polydimethylsiloxane is commercially available from Crompton of Middlebury, Conn. under the trade name SAG 100. If present, the concentration of a defoaming agent in the underfill solution is typically kept near the minimum concentration at which effective degassing is accomplished because high concentrations can decrease adhesion. In general, the concentration of defoaming agent is no greater than about 1 weight percent of the underfill solution. Preferably, the concentration of defoaming agent is between about 0.05 and about 0.5 weight percent of the underfill solution.

A cured epoxy resin typically has a coefficient of linear thermal expansion (CTE) that is between about 50 and about 80 ppm/degree ° C. and acts to reduce the CTE mismatch between the solder and the substrate materials. To still further reduce any CTE mismatch between the integrated circuit, the solder, and the circuit board, the underfill solution may comprise a coefficient of thermal expansion modifier component, which is often referred to as a filler. The CTE modifying component has a CTE that is more compatible with the substrates (e.g., the flip chip and circuit board) thereby decreasing the thermal stress upon thermal cycling. The CTE modifying component is electrically insulating and has a CTE that is preferably less than about 10 ppm/° C. Exemplary CTE modifying component materials include beryllium oxide (about 8.8 ppm/° C.), aluminum oxide (about 6.5-7.0 ppm/° C.), aluminum nitride (about 4.2 ppm/° C.), silicon carbide (about 4.0 ppm/° C.), silicon dioxide (about 0.5 ppm/° C.), low expansion ceramic or glass powders (between about 1.0 to about 9.0 ppm/° C.), and mixtures thereof. If present, the CTE modifying component preferably comprises silicon dioxide.

The maximum particle size of the CTE modifying component (i.e., the maximum cross-sectional distance of the particle) is preferably less than the height of the solder bumps to minimize any negative impact on solder joint integrity. Typically, the average particle size of conventional CTE modifying materials is between about 0.5 and about 15 microns. Nanoparticle fillers, which typically have a mean particle size of about 10 nm to 500 nm, may also be used. Although the amount of the filler in the underfill depends on the particular application, if present, the amount of CTE modifying component suspended or dispersed in the underfill solution is typically between about 10 and about 90 weight percent of the underfill solution.

A leveling (wetting) agent may be included to decrease the surface tension of the underfill solution, which allows the underfill solution to flow more readily during application of the solution and/or during placement of the electronic component to the substrate having the underfill solution deposited thereon. Additionally, the leveling agent may also enhance the ability of the underfill solution to wet the surface(s) being bonded. Conventional leveling agents fall within four categories: 1) fluorosurfactants; 2) organomodified silicon; 3) organo-titanates and organo-zirconates (Kenrich Petrochemicals, Inc.); and 4) and acrylics. The leveling agent may comprise any one or more of the foregoing leveling agent types. If present, the leveling agent typically comprises between about 0.01 and about 1.2 weight percent of the underfill solution. For example, in one embodiment the underfill solution comprises a leveling agent at a concentration that is about 0.5 weight percent of the underfill solution.

A silane coupling agent may be included in the underfill solution to improve the adhesion of the underfill to various substrates. Typically, a silane coupling agent comprises organomodified silicon molecules. If present, the concentration of the silane coupling agent is at a concentration that is between about 0.5 to about 2 weight percent of the underfill solution. In embodiment the silane coupling agent comprises about 0.5 weight percent of the underfill solution.

Preparation of the Underfill Composition

As a general proposition, the underfill solution is prepared by mixing together the various constituents. Typically, the preparation process comprises mixing the selected constituents in, for example, a planetary mixer. If desired, some solvent may be added to assist in the mixing. Preferably, the mixing process is performed under a vacuum to reduce or eliminate the entrapment of gas in the underfill solution.

In preparing the NUF compositions of the invention, the invention encompasses an order of mixing which has been discovered to facilitate formation of a composition having reduced voiding potential, increased fluxing activity, good pot life and shelf life (viscosity stability), and other advantages. In particular, the solid phenolic component is first dispensed in the epoxy resin component. In the preferred embodiment, all of the phenolic component is blended with the epoxy component in this first blending operation. In an alternative embodiment, less than all, for example, at least about 80 wt %, of the phenolic component is blended with the epoxy component in the first blending operation, and the remaining phenolic component is blended in later with the other components. This first blending operation yields an epoxy/phenolic blend.

Before adding the anhydride component, this epoxy/phenolic blend is heated to a temperature above the softening temperature of the phenolic component, which is typically above about 80° C., and often above about 100° C., using high-shear mixing. While the temperature to which the blend is heated is above about 80 or 100° C., it is maintained below a temperature at which the risk or tendency of epoxy polymerization occurring is substantially increased. For many embodiments, therefore, the temperature is maintained below about 170° C. After a uniform mixture at this temperature is obtained, the epoxy/phenolic blend is allowed to cool. Upon cooling to below about 40° C., the anhydride is added. In the event a liquid or semi-solid phenolic resin is used as the phenolic component, this heating is not required. To the extent there are other additives, they are also added at this point. These components are then mixed by conventional high-shear dispersing techniques. However, the timing of the adding of any other additives such as the coupling agents and the toughening agents is not narrowly critical. In particular, they may be added prior to the heating step.

After a uniform mixture is obtained, the mixture is degassed under vacuum, and packaged. The product is preferably stored at a temperature below about −20° C.

It has been discovered that by following the foregoing protocol, premature reaction between the phenolic and anhydride components is avoided or at least substantially reduced. Accordingly, this dramatically reduces the viscosity of the blend, increases the pot life, and reduces the consumption of these component through premature reaction, which otherwise would leave less of the hardener components available for reaction with the epoxy, epoxy as taught by: [1] H. Lee and K. Neville, "Handbook of Epoxy Resins, 1982-reissue" page 5-18 (1982, McGraw-Hill, N.Y.) and [2] W. Blank, Z. He and M. Picci: "Catalysis of the Epoxy-Carboxyl Reaction," Proceeding, Int. Waterborne, High-Solids and Powder Coatings Symposium Feb. 21-23, 2001 New Orleans, La. While thereby increasing the efficiency of the hardener components, this permits the use of less overall hardener proportion, which has among its advantages higher cross-link density and $T_g$.

Without being bound to a particular theory, it is believed that by predissolving the phenolic component in the epoxy, the risk that the phenolic component will overly react with the anhydride component is reduced. Also, the risk of the phenolic component reacting with the epoxy component is reduced, because the predissolving is performed at not too hot of a temperature, with high shear mixing, and in the absence of catalyst. Also, it is thought that the anhydride does not open up because it is not blended in until the epoxy/phenolic blend is cooled, and because of the nature of the catalyst.

The invention is further demonstrated by the following examples.

EXAMPLE 1

In preparing an underfill composition, 9.6 parts Paraloid® EXL 2330 core-shell rubber were pre-dispersed in 38 parts liquid diglycidylether of bis-phenol F (DGEBPF) using a high-shear centrifugal lab mixer. The pre-blend was then charged into a glass container, along with an additional 62 parts DGEBPF, 30.2 parts solid phenolic novolac resin, and 1.9 parts Silquest® A-189 mercaptopropyl-trimethoxysilane. The mixture was heated to 125° C. on an electric hot plate and homogenized for 25 minutes using a single-shaft mixer with a high-intensity radial impeller. The viscous pinkish-to-orange opaque mixture was allowed to cool to approximately 40° C., at which point 48.8 parts methyl-hexahydrophthalic anhydride (MHHPA) was added, along with a finely-ground mixture of 0.76 parts tetraphenylphosphonium tetraphenylborate (TPP-K)and 0.08 parts fumed silica (R-972 from Degussa)(0.84 parts TPP-K/fumed silica blend). The mixture was vigorously mixed for an additional 10 minutes at room temperature, and then degassed under vacuum (<25 mmHg) for 90 minutes.

EXAMPLE 2

An underfill composition was prepared according to the protocol of Example 1, except that 0.48 parts Intelimer® 7024 polymer-bound imidazole was used in place of the TPP-K/fumed silica blend.

COMPARATIVE EXAMPLE 1

An underfill composition was prepared according to the protocol of Example 1, except that the proportion of solid phenolic novolac resin was reduced to 14 parts, the proportion of MHHPA was increased to 81.0 parts, and the TPP-K/fumed silica blend was increased to 1.04 parts.

COMPARATIVE EXAMPLE 2

An underfill composition was prepared by charging 100 parts DGEBPF, 14.0 parts solid phenolic novolac resin, 9.6 parts Paraloid® EXL 2330 core-shell rubber, 1.9 parts Silquest® A-189 mercaptopropyl-trimethoxysilane, and 81.0 parts MHHPA into a glass container. These were homogenized for 25 minutes at 125° C. using a single-shaft mixer with a high-intensity radial impeller. When cooled to room temperature, 0.19 parts Curazol 2E4MZ (Air Products) was added to the mixture with stirring. The blend was then degassed under vacuum (<25 mmHg) for 90 minutes.

COMPARATIVE EXAMPLE 3

Core-shell rubber (9.6 parts Paraloid® EXL 2330) was pre-dispersed in 38 parts DGEBPF using a high-shear centrifugal lab mixer. The pre-blend was then charged into a glass container, along with an additional 62 parts DGEBPF, 1.9 parts Silquest® A-189 mercaptopropyl-trimethoxysilane, and 103.7 parts MHHPA. In a separate step, 16.2 parts hydrogenated bis-phenol A (Aldrich) were finely ground with 1.6 parts fumed silica, added to the mixture, and then blended at room temperature for 25 minutes using a single-shaft mixer with a high-intensity radial impeller. (Note: attempts to produce a homogenous, single-phase blend of the hydrogenated bisphenol-F and epoxy resin through melt blending were unsuccessful, due to the high melting point of the hydrogenated bisphenol-A, and its incompatibility with the epoxy resin, leading to gross phase separation). Finally, to this mixture was added a finely ground mixture of 1.04 parts TPP-K and 0.1 parts fumed silica, using vigorous mixing for 10 minutes. The blend was then degassed under vacuum (<25 mmHg) for 90 minutes.

COMPARATIVE EXAMPLE 4

An underfill composition was prepared according to the protocol of Comparative Example 3, except using 4.1 parts glycerol (Aldrich)in place of hydrogenated bis-phenol A, and increasing the TPP-K/fumed silica blends to 1.34 parts.

COMPARATIVE EXAMPLE 5

An underfill composition was prepared according to the protocol of Example 1, except using a finely-ground mixture 0.74 parts Curezol 2MA-OK imidazole salt (Air Products) and 0.07 parts fumed silica, in place of the TPP-K/fumed silica blend.

COMPARATIVE EXAMPLE 6

An underfill composition was prepared according to the protocol of Example 1, except using 0.20 parts Curezol® 2E4MZ imidazole (Air Products), an imidazole, in place of the TPP-K/fumed silica blend.

COMPARATIVE EXAMPLE 7

An underfill composition was prepared according to the protocol of Example 1, except using a finely ground mixture of 0.76 parts triphenylphosphine and 0.08 parts fumed silica in place of the TPP-K/fumed silica blend.

COMPARATIVE EXAMPLE 8

An underfill composition was prepared according to the protocol of Example 1, except melt-blending the epoxy resin, the solid phenolic resin, the A-189 silane, the Paraloid 2330 toughening agent and the MHHPA together for 25 minutes at 125° C., allowing to cool to 40° C., then adding the TPP-K catalyst.

EXAMPLE 3

The underfill compositions of Example 1 and Comparative Examples 1-7 were evaluated for the following characteristics:
1) Initial Brookfield Viscosity (ISO 2555)
2) Characteristic temperatures $T_{peak}$ and $T_g$ (ISO 11357-5)
3) Fluxing ability
5) Voiding characteristics
6) Weight loss To assess fluxing ability, approximately 0.5 ml of each NUF composition was dispensed onto a 7×3 cm strip of Copper/OSP-coated FR4 laminate. Three 35.4-mil diameter eutectic 63Sb37Pb solder spheres were placed in the liquid, and subjected to standard JEDEC eutectic reflow profile (220° C. peak, time above liquidus=60 sec). After reflow, the spheres were examined for evidence of collapse and wetting onto the copper, as evidenced by an increase in the sphere diameter. X-ray images consisted generally of a dark central circle, surrounded by a lighter "halo." The % increase in sphere diameter (calculated as 100×[(Rf/Ri)−1], where Rf is the diameter of the dark central images after reflow, and Ri is the diameter of the x-ray image before reflow), is taken as an indicator of the fluxing ability of the NUF.

For the voiding analysis, the underfill was placed under a 13×13 mm glass die having twenty-four eutectic bumps of 50-mil pitch. The die was attached to an FR-4 organic substrate with Cu pads. The assembly was subjected to a standard JEDEC eutectic reflow, and then examined using scanning acoustic microscopy to assess the extent of voiding.

Weight loss was analyzed using a Perkin-Elmer Model Pyris 1 Thermo-Gravimetric Analyzer using a sample size of 7-8 mg, a heating rate of 10° C./min from 25 to 275° C., and a nitrogen atmosphere.

The results of these evaluations are presented in Table 1:

Comparative Examples 3 and 4 demonstrate that aliphatic polyols (glycerol, hydrogenated bisphenol A) at a similar molar concentration of active hydrogen, have greater tendency towards voiding.

Comparative Example 5 shows that an alternate conventional latent catalyst (imidazole adduct) is not as effective as phosphonium salts or polymer-bound imidazoles in maintaining low viscosity.

Comparative Examples 6 and 7 show that, in contrast to the preferred embodiment of Examples 1 and 2, and Comparative Example 2, the conventional catalysts Curezol 2E4MZ or TPP organophosphine are not suitable when the molar ratio of anhydride and phenolic hardeners is comparable, i.e. close to 1.

Comparative Example 8, with its high viscosity and poor pot-life, illustrates the advantage of the order of addition, as disclosed in the preferred embodiment, for achieving the desired material properties.

The present invention is not limited to the above embodiments and can be variously modified. The above description of preferred embodiments is intended only to acquaint others skilled in the art with the invention, its principles and its practical application so that others skilled in the art may

TABLE 1

|  | Viscosity-initial, cP | Viscosity after 4 hrs, 23° C. | DSC $T_{peak}$* (*initial or largest peak) | TGA weight loss, % | DSC $T_g$ | Fluxing (% diameter increase) | voids (% area under die) |
|---|---|---|---|---|---|---|---|
| Ex. 1 (Preferred) | 7,800 | 9,840 | 185 | 11.9 | 101 | 130 | 0 |
| Ex. 2 (Preferred) | 10,270 | 13,190 | 182 | 8.3 | 98 | 138 | 0 |
| Comparative Ex. 1 | 1,200 | 1,430 | 191 | 20.6 | 109 | 140 | 1 |
| Comparative Ex. 2 | 2,980 | 3,320 | 185 | 16.1 | 108 | 143 | 0 |
| Comparative Ex. 3 | <1,000 | 1,020 | 191 | 19.6 | 109 | 96* (irregular shape) | 2 |
| Comparative Ex. 4 | <1,000 | 1,030 | 191 | 20.1 | 108 | 127 | 1 |
| Comparative Ex. 5 | 5,300 | 30,000 | 182 | 8.0 | 88 | 113* (irregular shape) | 0 |
| Comparative Ex. 6 | 19,800 | >50,000 | 188 | 8.4 | 97 | 105* (irregular shape) | 0 |
| Comparative Ex. 7 | 16,500 | >50,000 | 184 | 9.1 | 96 | 121 | 0 |
| Comparative Ex. 8 | 21,000 | 46,000 | 186 | 9.2 | 99 | 140 | 2 |

The embodiments of the invention (Examples 1 and 2) show excellent fluxing ability, comparatively low TGA weight loss, low voiding, and stable room temperature viscosity (good pot life).

Comparative Example 1 with a lower concentration of solid phenolic novolac and increased anhydride shows increased voiding, and greater TGA weight loss, as compared to the preferred embodiment. The material does, however, possess a lower viscosity.

Comparative Example 2 is of similar composition to Comparative Example 1, but is made using a conventional blending procedure (all materials except the catalyst are charged, heated and mixed together), and 2E4MZ catalyst. The material has a greater weight loss as compared to the preferred embodiment. The material does, however, possess a lower viscosity.

adapt and apply the invention in its numerous forms, as may be best suited to the requirements of a particular use.

With reference to the use of the words "comprise" or "comprises" or "comprising" in this entire specification (including the claims below), it is noted that unless the context requires otherwise, those words are used on the basis and clear understanding that they are to be interpreted inclusively, rather than exclusively, and that it is intended each of those words to be so interpreted in construing this entire specification.

What is claimed is:

1. A method of preparing a dispensable underfill composition of the type comprising an epoxy component, an anhydride component, and a phenolic component for use in electronics manufacture, the method comprising the following steps in order:

(1) blending the epoxy component and at least about 80 wt % of the phenolic component to yield an epoxy/phenolic blend;
(2) heating the epoxy/phenolic blend to a temperature greater than a softening temperature of the phenolic component and below a temperature at which the epoxy component and phenolic component polymerize;
(3) cooling the epoxy/phenolic blend; and
(4) blending the anhydride component into the epoxy/phenolic blend to yield the dispensable underfill composition.

2. The method of claim 1 wherein said cooling the epoxy/phenolic blend comprises cooling to a temperature below about 40° C.

3. The method of claim 1 wherein the blending the epoxy component and the at least about 80 wt % of the phenolic component to yield an epoxy/phenolic blend comprises blending the epoxy component and substantially all of the phenolic component.

4. The method of claim 2 wherein the blending the epoxy component and the at least about 80 wt % of the phenolic component to yield an epoxy/phenolic blend comprises blending the epoxy component and substantially all of the phenolic component.

5. The method of claim 1 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.1:1 and about 2:1.

6. The method of claim 1 wherein the blending the epoxy component and the blending the anhydride component yield a molar ratio of epoxy component to total hardener of between about 0.6:1 and about 1.4:1, wherein the total hardener is a cumulative of the phenolic component and the anhydride component.

7. The method of claim 2 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.1:1 and about 2:1.

8. The method of claim 2 wherein the blending the epoxy component and the blending the anhydride component yield a molar ratio of epoxy component to total hardener of between about 0.6:1 and about 1.4:1, wherein the total hardener is a cumulative of the phenolic component and the anhydride component.

9. The method of claim 3 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.1:1 and about 2:1.

10. The method of claim 3 wherein the blending the epoxy component and the blending the anhydride component yield a molar ratio of epoxy component to total hardener of between about 0.6:1 and about 1.4:1, wherein the total hardener is a cumulative of the phenolic component and the anhydride component.

11. The method of claim 1 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof.

12. The method of claim 1 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof, and wherein the blending the additives is performed after the cooling the epoxy/phenolic blend.

13. The method of claim 2 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof.

14. The method of claim 2 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof, and wherein the blending the additives is performed after the cooling the epoxy/phenolic blend.

15. The method of claim 5 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof.

16. The method of claim 6 further comprising blending additives into the epoxy/phenolic blend, wherein the additives are selected from the group consisting of wetting agents, defoaming agents, flow-enhancers, dispersing aids, flame retardants, coupling agents, stress reducing agents, CTE modifiers, and combinations thereof, and wherein the blending the additives is performed after the cooling the epoxy/phenolic blend.

17. The method of claim 1 further comprising blending a latent catalyst into the epoxy/phenolic blend.

18. The method of claim 1 further comprising blending a latent catalyst into the epoxy/phenolic blend, wherein the blending the latent catalyst is performed after the cooling the epoxy/phenolic blend.

19. The method of claim 2 further comprising blending a latent catalyst into the epoxy/phenolic blend.

20. The method of claim 2 further comprising blending a latent catalyst into the epoxy/phenolic blend, wherein the blending the latent catalyst is performed after the cooling the epoxy/phenolic blend.

21. The method of claim 5 further comprising blending a latent catalyst into the epoxy/phenolic blend.

22. The method of claim 5 further comprising blending a latent catalyst into the epoxy/phenolic blend, wherein the blending the latent catalyst is performed after the cooling the epoxy/phenolic blend.

23. The method of claim 6 further comprising blending a latent catalyst into the epoxy/phenolic blend.

24. The method of claim 6 further comprising blending a latent catalyst into the epoxy/phenolic blend, wherein the blending the latent catalyst is performed after the cooling the epoxy/phenolic blend.

25. The method of claim 1 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

26. The method of claim 2 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

27. The method of claim 6 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

28. The method of claim 12 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

29. The method of claim 17 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

30. The method of claim 18 wherein the blending the anhydride component into the epoxy/phenolic blend to yield the underfill composition comprises blending the anhydride component into the epoxy/phenolic blend in an amount such that the underfill composition has a molar ratio of phenolic component to anhydride component of between about 0.8:1 and about 1.2:1.

31. The method of claim 1 wherein heating the epoxy/phenolic blend to a temperature greater than a softening temperature of the phenolic component comprises heating to a temperature above about 80° C.

32. The method of claim 2 wherein heating the epoxy/phenolic blend to a temperature greater than a softening temperature of the phenolic component comprises heating to a temperature above about 80° C.

33. The method of claim 1 wherein the phenolic component is a semi-solid or liquid phenolic resin.

34. The method of claim 2 wherein the phenolic component is a semi-solid or liquid phenolic resin.

35. The method of claim 5 wherein the phenolic component is a semi-solid or liquid phenolic resin.

36. The method of claim 9 wherein the phenolic component is a semi-solid or liquid phenolic resin.

37. The method of claim 1 wherein the phenolic component is a solid phenolic novolac compound.

38. The method of claim 2 wherein the phenolic component is a solid phenolic novolac compound.

39. The method of claim 5 wherein the phenolic component is a solid phenolic novolac compound.

40. The method of claim 9 wherein the phenolic component is a solid phenolic novolac compound.

41. The method of claim 17 wherein the latent catalyst is selected from the group consisting of polymer-bound catalysts and phosphonium salt-based catalysts.

42. The method of claim 19 wherein the latent catalyst is selected from the group consisting of polymer-bound catalysts and phosphonium salt-based catalysts.

43. The method of claim 21 wherein the latent catalyst is selected from the group consisting of polymer-bound catalysts and phosphonium salt-based catalysts.

44. The method of claim 23 wherein the latent catalyst is selected from the group consisting of polymer-bound catalysts and phosphonium salt-based catalysts.

45. The method of claim 1 wherein the epoxy resin component comprises between about 25 weight percent and about 75 weight percent of the dispensable underfill composition, the anhydride component comprises between about 15 weight percent and about 90 weight percent of the dispensable underfill composition, and the phenolic component comprises between about 5 weight percent and about 60 weight percent of the dispensable underfill composition.

46. The method of claim 2 wherein the epoxy resin component comprises between about 25 weight percent and about 75 weight percent of the dispensable underfill composition, the anhydride component comprises between about 15 weight percent and about 90 weight percent of the dispensable underfill composition, and the phenolic component comprises between about 5 weight percent and about 60 weight percent of the dispensable underfill composition.

47. The method of claim 5 wherein the epoxy resin component comprises between about 25 weight percent and about 75 weight percent of the dispensable underfill composition, the anhydride component comprises between about 15 weight percent and about 90 weight percent of the dispensable underfill composition, and the phenolic component comprises between about 5 weight percent and about 60 weight percent of the dispensable underfill composition.

48. The method of claim 9 wherein the epoxy resin component comprises between about 25 weight percent and about 75 weight percent of the dispensable underfill composition, the anhydride component comprises between about 15 weight percent and about 90 weight percent of the dispensable underfill composition, and the phenolic component comprises between about 5 weight percent and about 60 weight percent of the dispensable underfill composition.

* * * * *